(12) United States Patent
Wang

(10) Patent No.: US 12,147,280 B2
(45) Date of Patent: Nov. 19, 2024

(54) CASING AND PUSHING MECHANISM

(71) Applicant: WISTRON CORP., New Taipei (TW)

(72) Inventor: Jun-Hao Wang, New Taipei (TW)

(73) Assignee: WISTRON CORP., New Taipei (TW)

( * ) Notice: Subject to any disclaimer, the term of this patent is extended or adjusted under 35 U.S.C. 154(b) by 257 days.

(21) Appl. No.: 17/737,087

(22) Filed: May 5, 2022

(65) Prior Publication Data

US 2023/0221776 A1 Jul. 13, 2023

(30) Foreign Application Priority Data

Jan. 7, 2022 (CN) .......................... 202210017039.9

(51) Int. Cl.
| | | |
|---|---|---|
| *G06F 1/16* | (2006.01) | |
| *G06F 1/18* | (2006.01) | |
| *H05K 5/02* | (2006.01) | |
| *H05K 7/14* | (2006.01) | |

(52) U.S. Cl.
CPC ............ *G06F 1/181* (2013.01); *H05K 5/0204* (2013.01); *H05K 5/0221* (2013.01); *H05K 7/1489* (2013.01)

(58) Field of Classification Search
CPC .. H05K 7/1489; H05K 5/0204; H05K 5/0221; H05K 5/0013; H05K 5/03; G06F 1/181
See application file for complete search history.

(56) References Cited

U.S. PATENT DOCUMENTS

| | | | |
|---|---|---|---|
| 7,327,565 B2 * | 2/2008 | Chen ....................... | G06F 1/187 |
| 11,419,229 B1 * | 8/2022 | An ....................... | H05K 7/1489 |
| 2005/0121581 A1 * | 6/2005 | Chen ....................... | G06F 1/184 |
| 2008/0000849 A1 * | 1/2008 | Zhang .................. | G11B 33/123 |
| | | | 211/26.2 |
| 2016/0064040 A1 * | 3/2016 | Hartman .............. | H05K 7/1402 |
| | | | 360/97.12 |

FOREIGN PATENT DOCUMENTS

CN 2681197 Y 2/2005

OTHER PUBLICATIONS

TW Office Action dated 2022-07-28 in Taiwan application No. 111102207.

* cited by examiner

*Primary Examiner* — Kimberley S Wright
(74) *Attorney, Agent, or Firm* — McClure, Qualey & Rodack, LLP

(57) ABSTRACT

A pushing mechanism, configured to be disposed on a case body, includes a fixed component, a slidable component and a pushing component. The slidable component is disposed on the fixed component and includes a connection plate and a guiding plate. The guiding plate protrudes from the connection plate and has a first supporting portion, a second supporting portion and an inclined guiding portion connected to the first supporting portion and the second supporting portion. The first supporting portion is closer to the connection plate than the second supporting portion. The pushing component is disposed on the fixed component. A slidable direction of the pushing component differs from a slidable direction of the slidable component. When the slidable component is moved relative to the fixed component, the pushing component is guided by the guiding plate to slide between the first supporting portion and the second supporting portion.

20 Claims, 11 Drawing Sheets

CASING AND PUSHING MECHANISM

CROSS-REFERENCE TO RELATED APPLICATIONS

This non-provisional application claims priority under 35 U.S.C. § 119(a) on Patent Application No(s). 202210017039.9 filed in China on Jan. 7, 2022, the entire contents of which are hereby incorporated by reference.

TECHNICAL FIELD

This disclosure relates to a casing and a pushing mechanism, more particularly to a casing and a pushing mechanism having a pushing component.

BACKGROUND

Nowadays, clients have requirements for the appearance of tower servers, so the casing of a tower server may be provided with additional cover plates at its exterior. The cover plates have coating coated thereon for having aesthetic appearances. When the coating on the cover plates is damaged or worn off, the clients would like to only replace the cover plates but not the whole casing so as to minimize maintenance costs. However, conventional cover plates are fixed on the casing via screws, such that it is troublesome for users to replace the cover plates. Accordingly, how to efficiently replace the cover plates is an important topic in this field.

SUMMARY

The present disclosure is to provide a casing and a pushing mechanism which is capable of allowing the efficiency of the replacement of cover plates to be improved.

One embodiment of the disclosure provides a pushing mechanism. The pushing mechanism is configured to be disposed on a case body. The pushing mechanism includes a fixed component, a slidable component and at least one pushing component. The fixed component is configured to be disposed on the case body. The slidable component is slidably disposed on the fixed component. The slidable component includes a connection plate and at least one guiding plate. The guiding plate protrudes from the connection plate, and the guiding plate has a first supporting portion, a second supporting portion and an inclined guiding portion. The first supporting portion is located closer to the connection plate than the second supporting portion to the connection plate. The inclined guiding portion is connected between the first supporting portion and the second supporting portion. The pushing component is slidably disposed on the fixed component. A slidable direction of the pushing component is different from a slidable direction of the slidable component. When the slidable component is moved relative to the fixed component, the pushing component is guided by the guiding plate of the slidable component to slide between the first supporting portion and the second supporting portion.

One embodiment of the disclosure provides a casing. The casing includes a case body, a cover and a pushing mechanism. The case body has at least one through hole portion. The cover has at least one first hook and covers the case body. The pushing mechanism is disposed on the case body. The pushing mechanism includes a fixed component, a slidable component and at least one pushing component. The fixed component is disposed on the case body. The slidable component is slidably disposed on the fixed component. The slidable component includes a connection plate and at least one guiding plate. The guiding plate protrudes from the connection plate. The guiding plate has a first supporting portion, a second supporting portion and an inclined guiding portion. The first supporting portion is located closer to the connection plate than the second supporting portion to the connection plate. The inclined guiding portion is connected between the first supporting portion and the second supporting portion. The connection plate of the slidable component can be moved relative to the fixed component so as to be detached from the first hook. The pushing component is slidably disposed on the fixed component. A slidable direction of the pushing component is different from a slidable direction of the slidable component. When the slidable component is moved relative to the fixed component, the pushing component is guided by the guiding plate of the slidable component to slide from the first supporting portion to the second supporting portion, and the pushing component pushes the cover such that the cover is at least partially spaced apart from the case body.

According to the casing and the pushing mechanism as described above, the connection plate of the slidable component is configured for the first hook of the cover to be engaged therewith, and the first supporting portion of the guiding plate of the slidable component is located closer to the connection plate than the second supporting portion to the connection plate. Therefore, when the slidable component is moved relative to the fixed component, the first hook of the cover can be engaged or disengaged from the connection plate, and the cover can be pushed upwards by the pushing component as the pushing component is supported by the second supporting portion, or the cover and the pushing component may be spaced apart from each other as the pushing component is supported by the first supporting portion. Accordingly, the user may install or remove the cover without using additional tools to fasten or remove screws, and the user is also able to move the cover upwards by the pushing component of the pushing mechanism so as to form a gap between the cover and the case body for user to put fingers therein, such that the user can easily hold and remove the cover.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
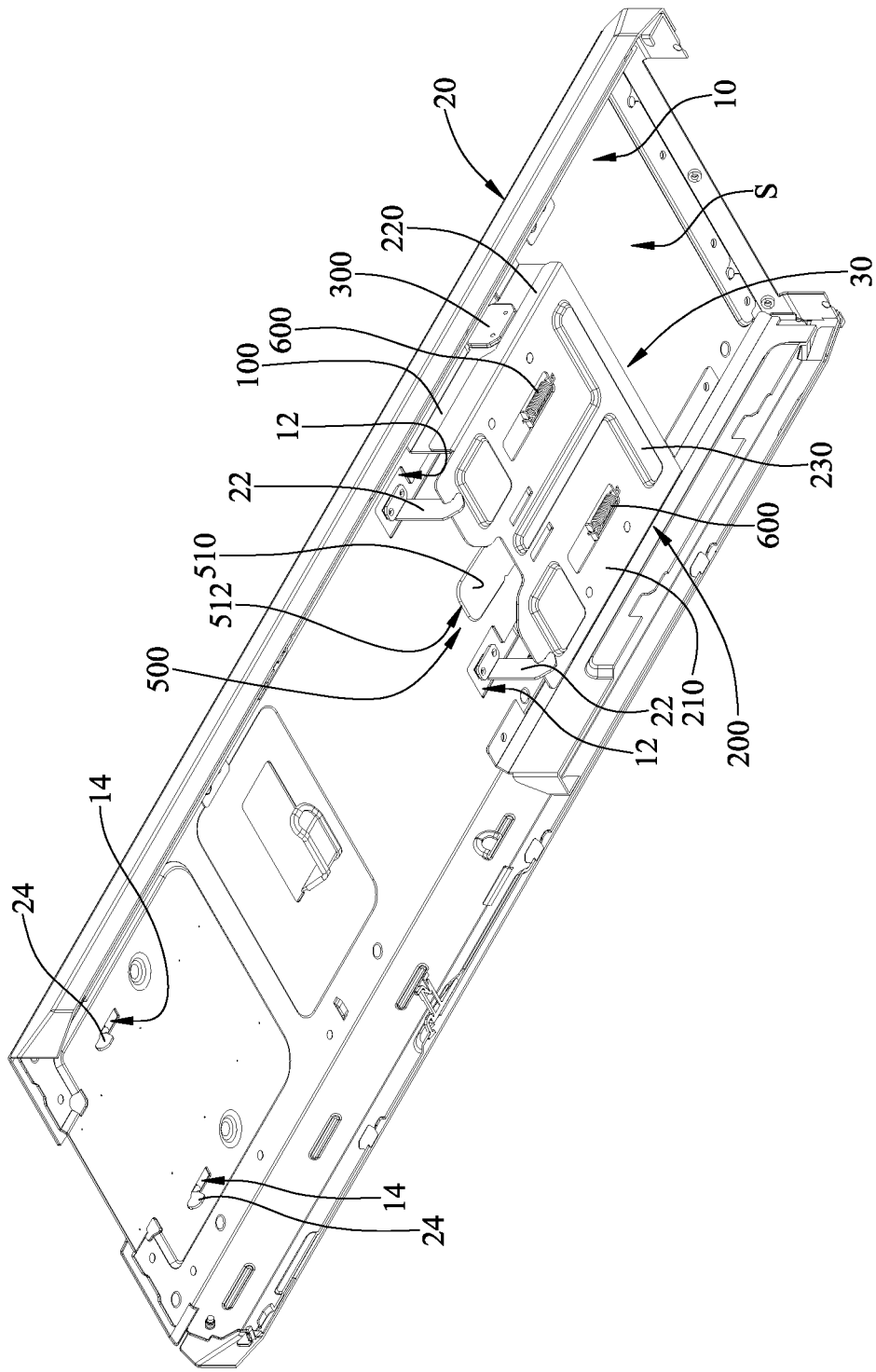
FIG. 1 is a partial perspective view of a casing in accordance with one embodiment of the disclosure.
Figure 2:
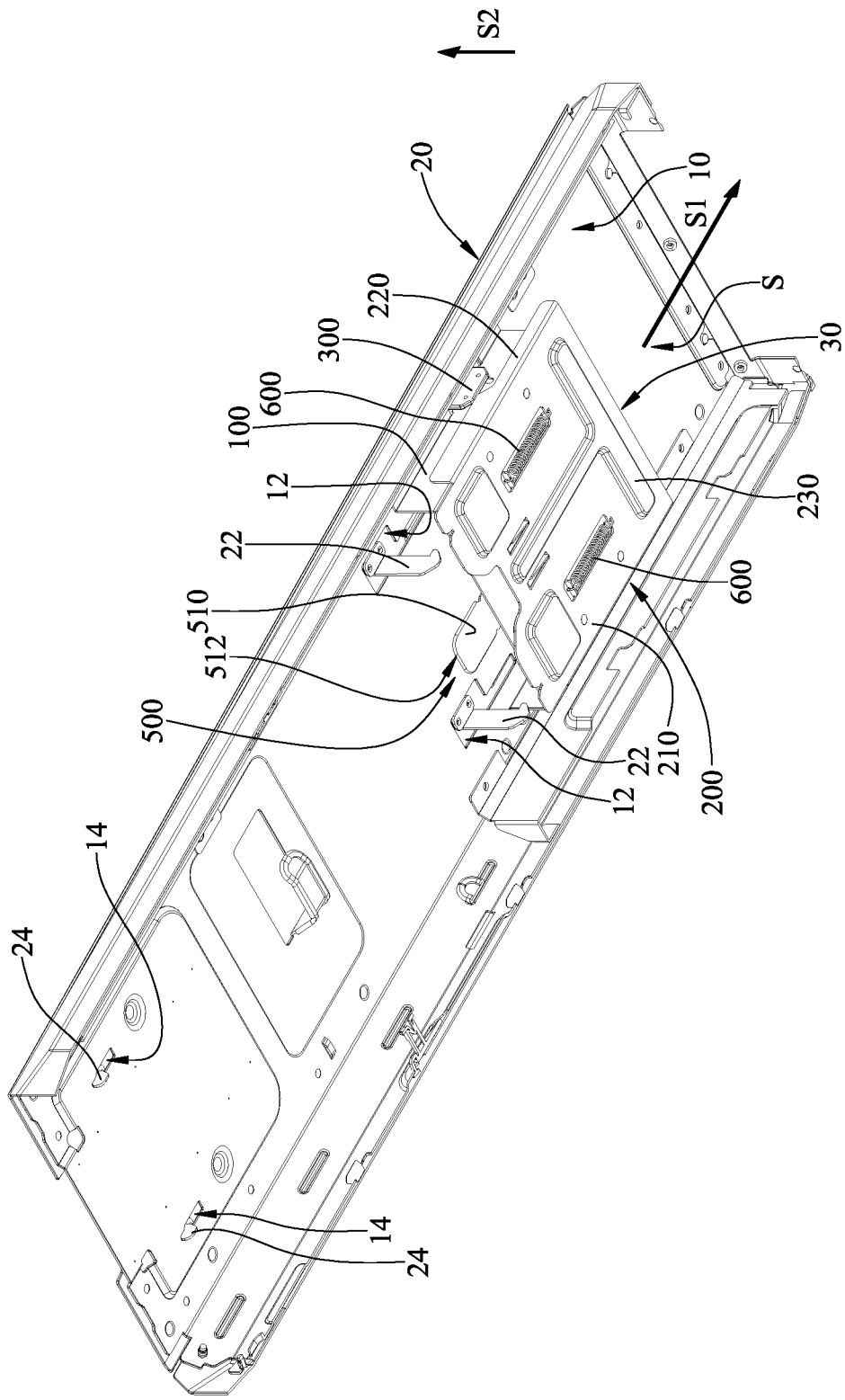
FIG. 2 is a perspective view showing a cover of the casing in FIG. 1 being opened.
Figure 3:
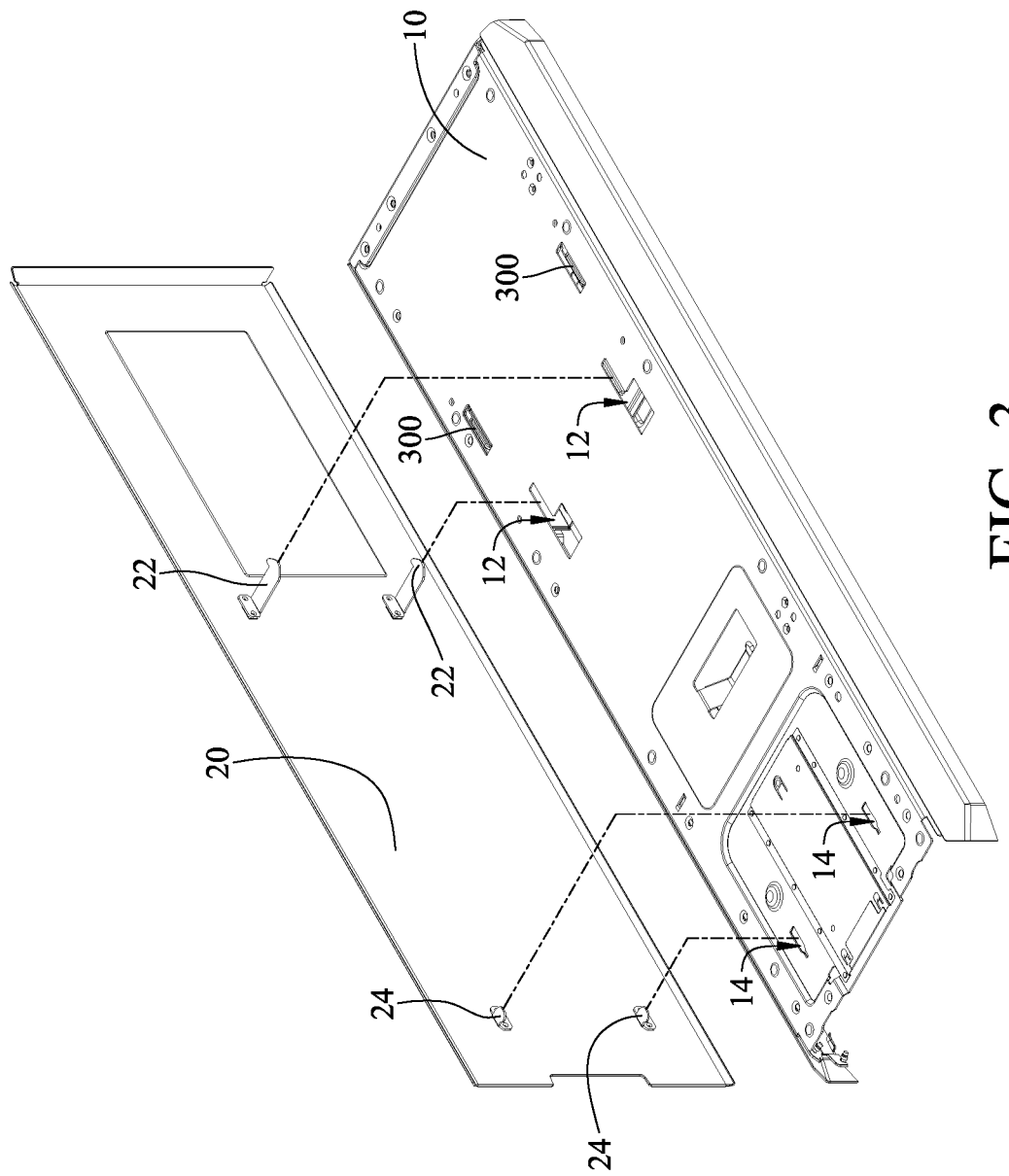
FIG. 3 is an exploded view of the casing in FIG. 1.
Figure 4:
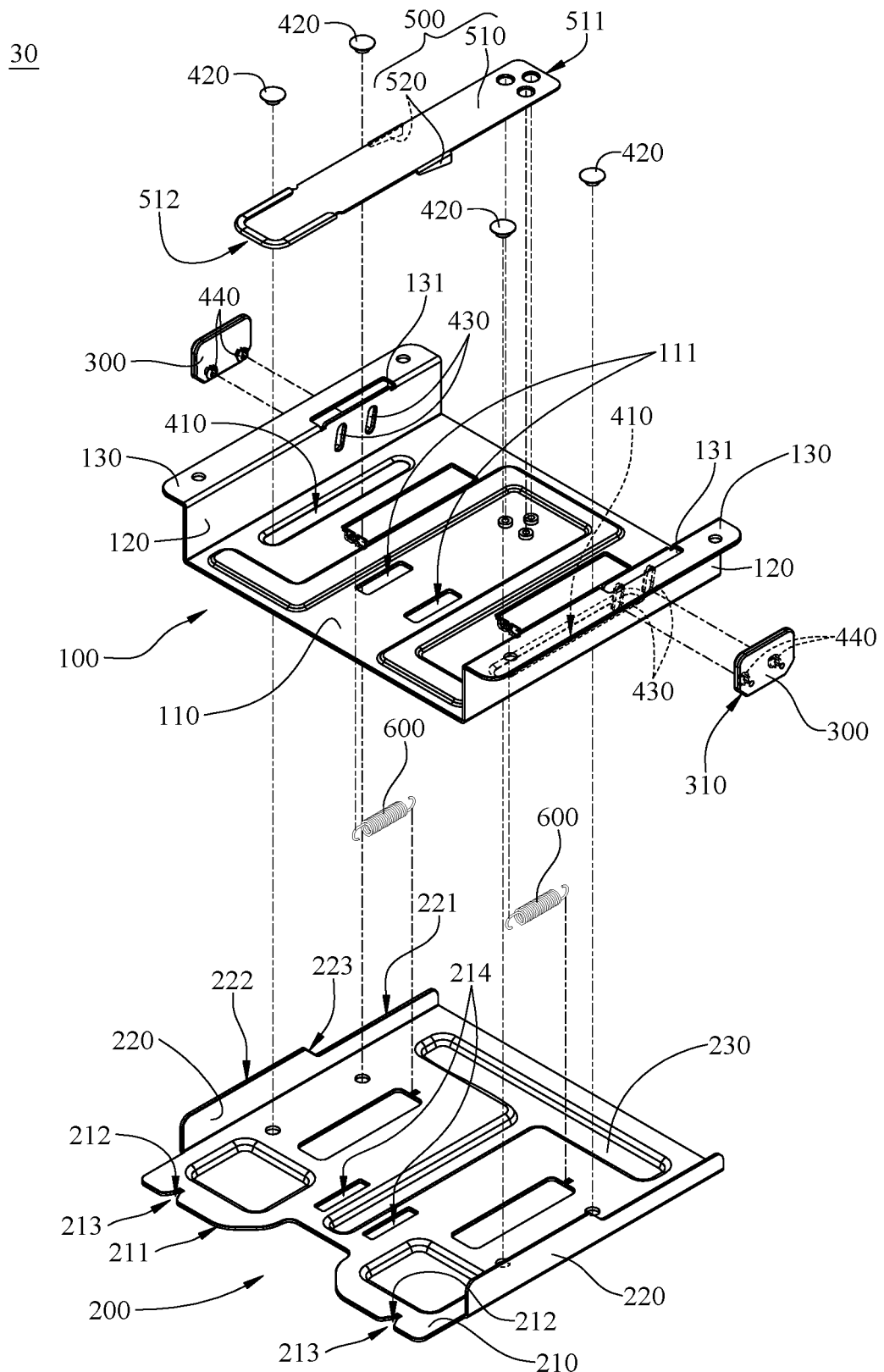
FIG. 4 is an exploded view of a pushing mechanism in FIG. 1.
Figure 5:
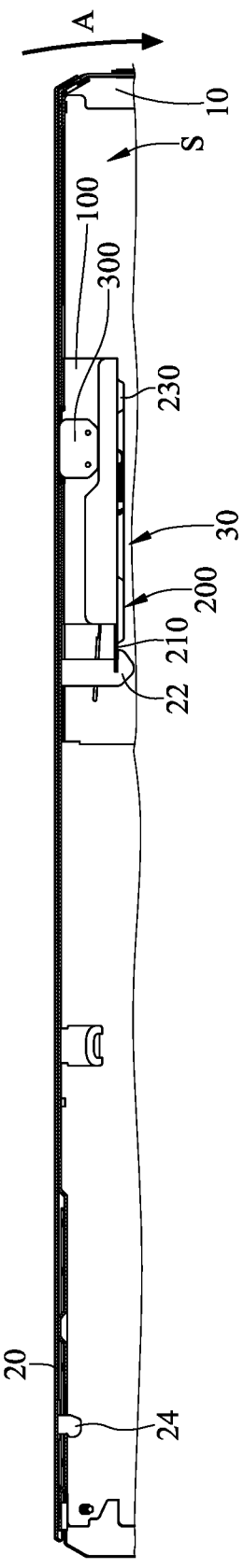
FIG. 5 is a cross-sectional view of the casing in FIG. 1.
Figure 6:
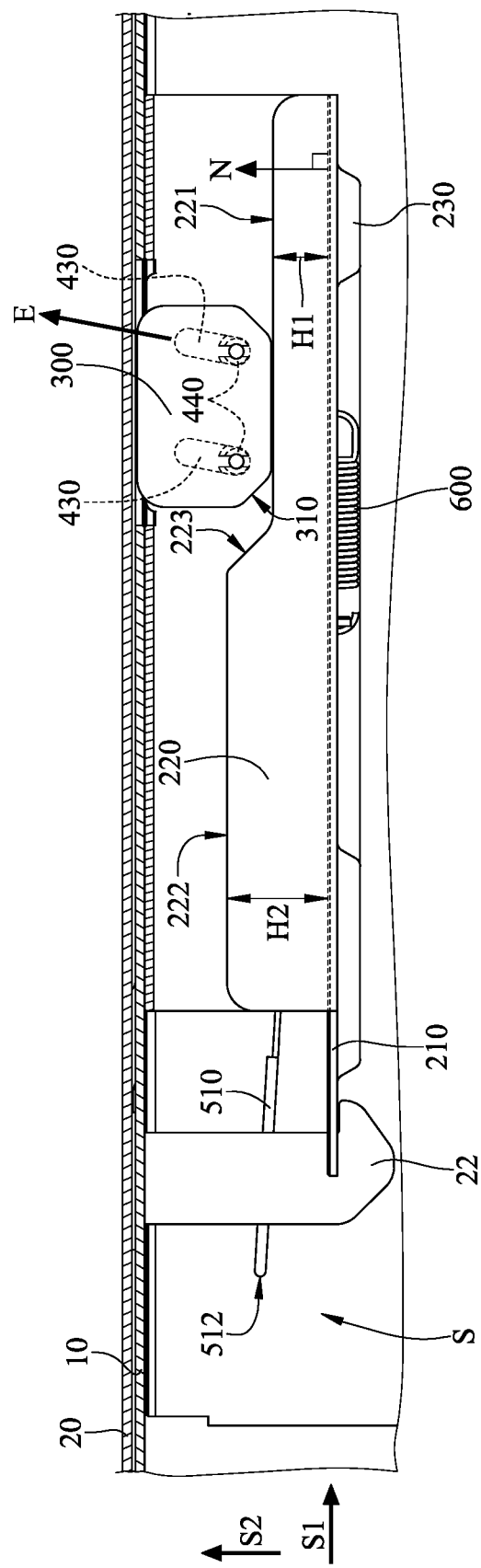
FIG. 6 is a partial and enlarged cross-sectional view of the casing in FIG. 5.

Please refer to FIG. 1 to FIG. 6. FIG. 1 is a partial perspective view of a casing 1 in accordance with one embodiment of the disclosure, FIG. 2 is a perspective view showing a cover 20 of the casing 1 in FIG. 1 being opened, FIG. 3 is an exploded view of the casing 1 in FIG. 1, FIG. 4 is an exploded view of a pushing mechanism 30 in FIG. 1, FIG. 5 is a cross-sectional view of the casing 1 in FIG. 1, and FIG. 6 is a partial and enlarged cross-sectional view of the casing 1 in FIG. 5.

As shown in FIG. 1 to FIG. 3, in this embodiment, the casing 1 includes a case body 10, a cover 20 and a pushing mechanism 30. The case body 10 has an accommodation space portion S, a plurality of through hole portions 12 and a plurality of engagement opening portions 14. The cover 20 is, for example, an appearance component treated by a coating process. The cover 20 covers one side of the case body 10 and has a plurality of first hooks 22 and a plurality of second hooks 24. The second hooks 24 are configured to be engaged with the engagement opening portions 14, such that the cover 20 is pivotable relative to the case body 10 using the second hooks 24 as fulcrums. The first hooks 22 are configured to be disposed through the through hole portions 12 and partially located in the accommodation space portion S, and the first hooks 22 are configured for the pushing mechanism 30 to be engaged therewith so as to fasten the cover 20 to the case body 10, which will be described in detail later. Furthermore, the drawings only illustrate a part of the casing 1 in order to clearly show the essential features of this embodiment. However, in practical, the casing 1 may include a bottom plate 110, a front plate, a back plate and two side plates 120 together forming the accommodation space portion S.

In this embodiment, the quantities of the through hole portions 12, the engagement opening portions 14, the first hooks 22 and the second hooks 24 are two, but the present disclosure is not limited thereto. In other embodiments, the quantities of through hole portion, engagement opening portion, first hook and second hook may be one, three or more.

As shown in FIG. 4 to FIG. 6, the pushing mechanism 30 is located in the accommodation space portion S of the case body 10. The pushing mechanism 30 includes a fixed component 100, a slidable component 200 and two pushing components 300. The fixed component 100 includes the bottom plate 110, the two side plates 120 and two connection plates 130. The two side plates 120 are respectively connected to two opposite sides of the bottom plate 110. The two connection plates 130 are respectively connected to sides of the two side plates 120 located relative far away from the bottom plate 110. The bottom plate 110, the two side plates 120 and the two connection plates 130 are, for example, formed by bending a metal sheet, the side plates 120 are, for example, perpendicular to the bottom plate 110, and the connection plates 130 are, for example, perpendicular to the side plates 120. The two connection plates 130 are fixed to the case body 10 by means of rivets, screws or welding process. In addition, each of the connection plates 130 has an opening portion 131 for the pushing component 300 to be disposed therethrough, which will be described in detail later.

The slidable component 200 includes a connection plate 210 and two guiding plates 220. The two guiding plates 220 respectively protrude from two opposite sides of the connection plate 210. The guiding plates 220 are substantially perpendicular to the connection plate 210 and the two guiding plates 220 are substantially parallel to each other. The connection plate 210 of the slidable component 200 is slidably disposed on the fixed component 100. In detail, the pushing mechanism 30 may further include a plurality of first slidable parts 410 and a plurality of second slidable parts 420. The first slidable parts 410 are, for example, grooves, and the second slidable parts 420 are, for example, I-shaped pins. The first slidable parts 410 are disposed on the bottom plate 110 of the fixed component 100, and the second slidable parts 420 are disposed on the connection plate 210 of the slidable component 200. The second slidable parts 420 are slidably disposed on the first slidable parts 410, such that the slidable component 200 is slidable relative to the fixed component 100.

In this embodiment, the connection plate 210 of the slidable component 200 may further have a side edge 211, a plurality of engagement groove parts 212 and a plurality of groove opening parts 213. The groove opening parts 213 are connected to the engagement groove parts 212 and located at the side edge 211, and the engagement groove parts 212 and the groove opening parts 213 are recessed inward from the side edge 211. The slidable component 200 can be moved relative to the fixed component 100 so as to be engaged or disengaged from the first hooks 22 which pass through the through hole portions 12. When the slidable component 200 is engaged with the first hooks 22, the first hooks 22 pass through the groove opening parts 213 and are engaged with the engagement groove parts 212. Moreover, said one object being substantially perpendicular to another object indicates that one object is perpendicular or nearly perpendicular to another object, and said two objects being substantially parallel to each other indicates that two objects are parallel to each other or nearly parallel to each other.

In this embodiment, the groove opening part 213 has a width increasing from one side thereof located closer to the engagement groove part 212 toward another side thereof located farther away from the engagement groove part 212. Therefore, the first hooks 22 can be easily guided into the engagement groove parts 212 via the groove opening parts 213 with larger width.

In this embodiment, the connection plate 210 has the engagement groove parts 212 and the groove opening parts 213 located at the side edge 211 for the first hooks 22 to be engaged with the engagement groove parts 212, but the present disclosure is not limited thereto. In other embodiments, a connection plate may only have an engagement groove part located at a side edge for a first hook to be directly engaged with the engagement groove part, or a connection plate may only have a side edge without an engagement groove part or a groove opening part for a first hook to be directly engaged with the side edge of the connection plate.

In this embodiment, each of the guiding plates 220 has a first supporting portion 221, a second supporting portion 222 and an inclined guiding portion 223, and the first supporting portion 221 is located closer to the connection plate 210 than the second supporting portion 222 to the connection plate 210. That is, a distance H1 between the first supporting portion 221 and the connection plate 210 is smaller than a distance H2 between the second supporting portion 222 and the connection plate 210. The inclined guiding portion 223 is connected between the first supporting portion 221 and the second supporting portion 222.

In this embodiment, the quantity of the guiding plates 220 is two, but the present disclosure is not limited thereto. In other embodiments, the quantity of guiding plate may be one, and the guiding plate is connected to one side of a connection plate.

In this embodiment, the slidable component 200 has an operation protrusion 230. The operation protrusion 230, for example, protrudes from the connection plate 210 for users to easily move the slidable component 200 by pushing the operation protrusion 230. Furthermore, the operation protrusion 230 is formed on the connection plate 210 by, for example and not limited to, a stamping process.

The pushing components 300 are slidably disposed on the fixed component 100. In detail, the pushing mechanism 30 may further include a plurality of third slidable parts 430 and a plurality of fourth slidable parts 440. The third slidable parts 430 are, for example, grooves, and the fourth slidable parts 440 are, for example, protrusions or I-shaped pins. The third slidable parts 430 are disposed on the side plates 120 of the fixed component 100, and the fourth slidable parts 440 are disposed on the pushing components 300. The fourth slidable parts 440 are respectively slidably disposed on the third slidable parts 430, such that the pushing components 300 are slidable relative to the fixed component 100. In this embodiment, when the slidable component 200 is moved relative to the fixed component 100, the pushing components 300 are pushed by the guiding plates 220 of the slidable component 200 to move relative to the fixed component 100, and a slidable direction S2 of the pushing components 300 is different from a slidable direction S1 of the slidable component 200. In detail, the pushing components 300 are respectively guided by the inclined guiding portions 223 of the guiding plates 220 of the slidable component 200 to slide from the first supporting portions 221 to the second supporting portions 222, and therefore, pass through the opening portions 131 of the connection plates 130. As such, the pushing components 300 are moved in a direction away from the connection plate 210 and push the cover 20 upwards, such that the cover 20 is partially spaced apart from the case body 10. In addition, an extension direction E of the third slidable parts 430 is at an acute angle to and a normal direction N of the connection plate 210, such that the process that the slidable component 200 moves the pushing components 300 can be smoother. However, the present disclosure is not limited to the angle between the extension direction E of the third slidable parts 430 and the normal direction N of the connection plate 210. In other embodiments, an extension direction of the third slidable parts 430 may be parallel to a normal direction of the connection plate 210.

In this embodiment, the quantity of the pushing components 300 is two for stably pushing the cover 20 upwards, but the present disclosure is not limited thereto. In other embodiments, the quantity of pushing component may be one.

In this embodiment, each of the pushing components 300 may further have an inclined guidance portion 310 configured to be in contact with the inclined guiding portion 223 of the guiding plate 220, such that the process that the slidable component 200 moves the pushing components 300 can be smoother. Note that the inclined guidance portion 310 of each of the pushing components 300 is optional and may be omitted in other embodiments.

In this embodiment, the bottom plate 110 of the fixed component 100 has a plurality of through hole parts 111, and the connection plate 210 of the slidable component 200 has a plurality of engagement hole parts 214. The pushing mechanism 30 may further include an engagement component 500. The engagement component 500 includes an elastic arm part 510 and a plurality of engaging protrusions 520 connected to each other. The elastic arm part 510 has a fixed end 511 and a movable end 512 located opposite to each other. The fixed end 511 of the elastic arm part 510 is fixed to the bottom plate 110 of the fixed component 100. The movable end 512 of the elastic arm part 510 extends beyond an outer edge of the bottom plate 110 of the fixed component 100 for easily moving the movable end 512 of the elastic arm part 510. The engaging protrusions 520 are disposed through the through hole parts 111 of the bottom plate 110 and are configured to be engaged with the engagement hole parts 214 of the connection plate 210 so as to fix the position of the slidable component 200 relative to the fixed component 100, such that the pushing components 300 are maintained in a position where the pushing components 300 are supported by the second supporting portions 222 of the guiding plates 220. That is, the pushing components 300 are maintained in a position where the cover 20 is pushed upwards relative to the case body 10 and supported by the pushing components 300, and a gap is formed between the cover 20 and the case body 10.

In this embodiment, the pushing mechanism 30 may, for example, further include a plurality of elastic components 600. The elastic components 600 are, for example, extension springs, and one end of each of the elastic components 600 is connected to the fixed component 100, and another end of each of the elastic components 600 is connected to the slidable component 200. Therefore, when the engaging protrusions 520 of the engagement component 500 is disengaged from the through hole parts 111 of the fixed component 100 and the engagement hole parts 214 of the slidable component 200, the slidable component 200 can be moved back to its original position by a force provided by the elastic components 600.

In this embodiment, the quantities of the elastic components 600, the engaging protrusions 520, the through hole parts 111 and the engagement hole parts 214 are two, but the present disclosure is not limited thereto. In other embodiments, the quantity of elastic component, engaging protrusion, through hole part and engagement hole part may be one.

In this embodiment, the engagement component 500 is fixed to the fixed component 100, and the engagement hole parts 214 are located at the connection plate 210, but the present disclosure is not limited thereto. In other embodiments, an engagement component may be fixed to a slidable component, and an engagement hole part may be located at a bottom plate.

Figure 7:
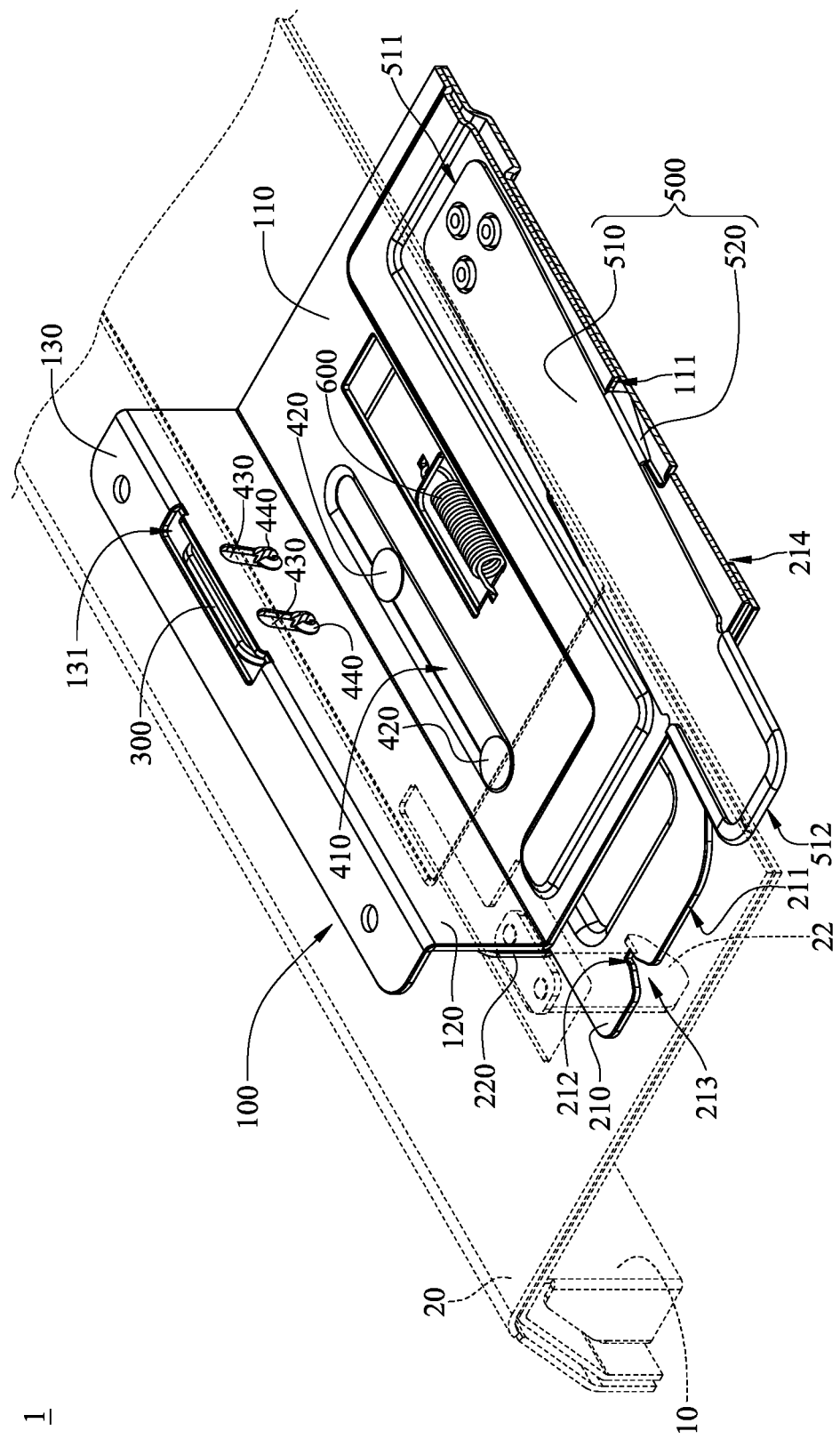
FIG. 7 is a sectional view of the pushing mechanism in FIG. 1.
Figure 8:
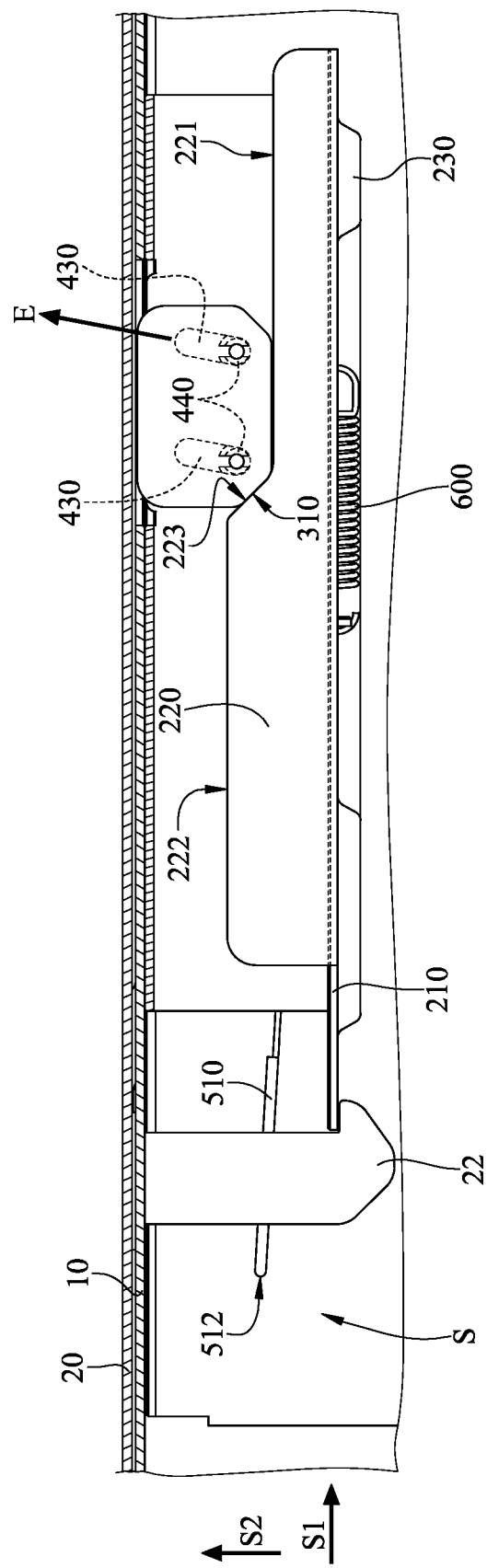
FIG. 8 is a cross-sectional view of a slidable component in FIG. 6 being moved a distance in one direction relative to a fixed component.
Figure 9:
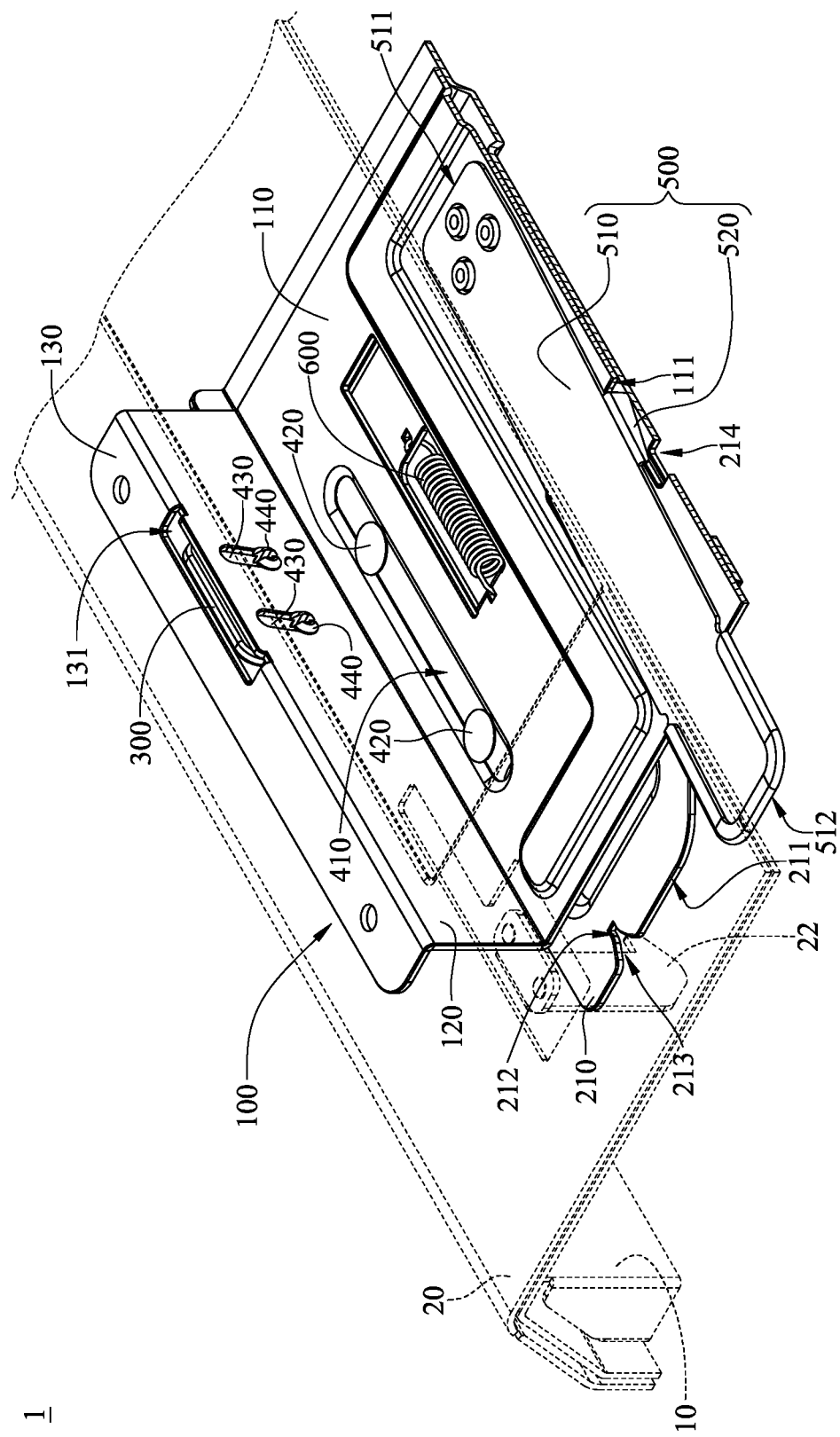
FIG. 9 is a perspective view of the slidable component in FIG. 7 being moved a distance in the direction relative to the fixed component.
Figure 10:
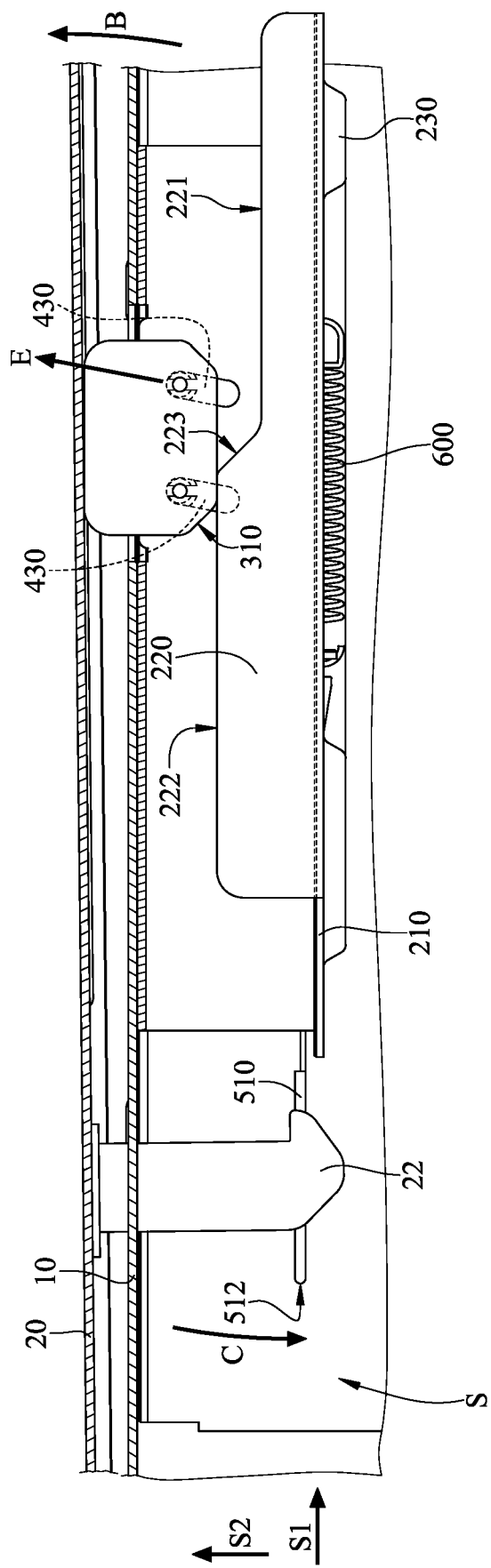
FIG. 10 is a cross-sectional view of the slidable component in FIG. 8 being further moved a distance in the direction relative to the fixed component.
Figure 11:
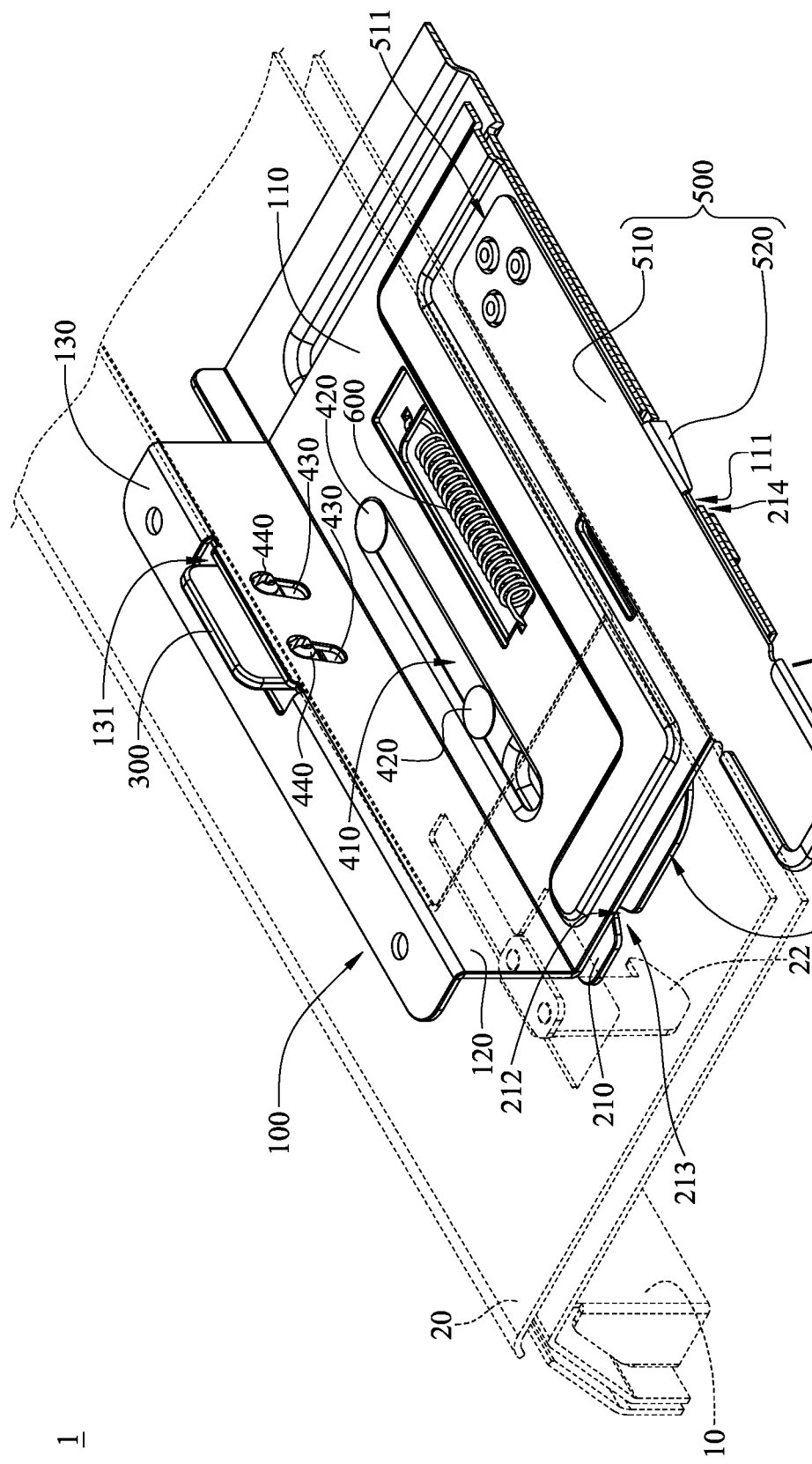
FIG. 11 is a perspective view of the slidable component in FIG. 9 being further moved a distance in the direction relative to the fixed component.

Please refer to FIG. 3, and FIG. 5 to FIG. 11. FIG. 7 is a sectional view of the pushing mechanism 30 in FIG. 1, FIG. 8 is a cross-sectional view of the slidable component 200 in FIG. 6 being moved a distance in the direction S1 relative to the fixed component 100, FIG. 9 is a perspective view of the slidable component 200 in FIG. 7 being moved a distance in the direction S1 relative to the fixed component 100, FIG. 10 is a cross-sectional view of the slidable component 200 in FIG. 8 being further moved a distance in the direction S1 relative to the fixed component 100, and FIG. 11 is a perspective view of the slidable component 200 in FIG. 9 being further moved a distance in the direction S1 relative to the fixed component 100.

As shown in FIG. 5, firstly, the second hooks 24 of the cover 20 are engaged with the engagement opening portions 14 of the case body 10, and the cover 20 is pivoted in a direction A using the second hooks 24 as fulcrums, such that the first hooks 22 are engaged with the connection plate 210 of the slidable component 200. Therefore, the installation of the cover 20 and the case body 10 can be done from the outside of the case body 10.

Then, as shown in FIG. 6 and FIG. 7, a user may force the slidable component 200 to move in the direction S1 using the operation protrusion 230. During the movement of the slidable component 200 in the direction S1, the pushing components 300 slide on the first supporting portions 221 of the guiding plates 220 and move towards the inclined guiding portions 223. Then, as shown in FIG. 8 and FIG. 9, when the user keeps forcing the slidable component 200 to move in the direction S1, the inclined guidance portions 310 of the pushing components 300 are in contact with the inclined guiding portions 223. Then, as shown in FIG. 10 and FIG. 11, when the user keeps forcing the slidable component 200 to move in the direction S1, the pushing components 300 are guided by the inclined guiding portions 223 to slide onto the second supporting portions 222. As such, the pushing components 300 are moved in the direction S2 so as to push the cover 20 to move upwards along a direction B, such that a gap is formed between the cover 20 and the case body 10. The gap is for the user to put the user's fingers therein, so that the cover 20 can be removed from the case body 10 more easily. In addition, when the pushing components 300 are supported by the second supporting portions 222 and the cover 20 is lifted upwards and supported by the pushing components 300, the user may keep forcing the slidable component 200 to move in the direction S1, such that the engaging protrusions 520 of the engagement component 500 can move in a direction C to engage with the through hole parts 111 of the bottom plate 110 and the engagement hole parts 214 of the connection plate 210. Therefore, even if the user releases the slidable component 200, the slidable component 200 can still be maintain in a position where the pushing components 300 are supported by the second supporting portions 222 of the guiding plates 220.

According to the above described operation, during the installation or removal of the cover 20, there is no need to use additional tools to fasten or remove screws. Also, the user is able to move the cover 20 upwards by the pushing components 300 of the pushing mechanism 30 so as to form a gap between the cover 20 and the case body 10 for putting the user's fingers therein, such that the user can easily hold and remove the cover 20.

In this embodiment, since the pushing mechanism 30 is located in the accommodation space portion S of the case body 10, when the user is about to use the pushing mechanism 30 to push the cover 20 to move upwards, the user may, beforehand, remove a side cover (not shown) of the casing 1 so as to expose the pushing mechanism 30 for proceeding the operation of the pushing mechanism 30.

In this embodiment, the pushing mechanism 30 is applied to the casing 1 and can push the cover 20 upwards for the user to easily remove the cover 20, but the present disclosure is not limited thereto. In other embodiments, a pushing mechanism may be applied to a battery box and can push batteries out of the battery box, or applied to an expansion card and can detach the expansion card from a connection port.

According to the casing 1 and the pushing mechanism 30 as described above, the connection plate 210 of the slidable component 200 is configured for the first hooks 22 of the cover 20 to be engaged therewith, and the first supporting portion 221 of the guiding plate 220 of the slidable component 200 is located closer to the connection plate 210 than the second supporting portion 222 to the connection plate 210. Therefore, when the slidable component 200 is moved relative to the fixed component 100, the first hooks 22 of the cover 20 can be engaged or disengaged from the connection plate 210, and the cover 20 can be pushed upwards by the pushing components 300 as the pushing components 300 are supported by the second supporting portions 222, or the cover 20 and the pushing components 300 may be spaced apart from each other as the pushing components 300 are supported by the first supporting portion 221. Accordingly, the user may install or remove the cover 20 without using additional tools to fasten or remove screws, and the user is also able to move the cover 20 upwards by the pushing components 300 of the pushing mechanism 30 so as to form a gap between the cover 20 and the case body 10 for user to put fingers therein, such that the user can easily hold and remove the cover 20.

In addition, the engagement component 500 is disposed on the fixed component 100 and engaged with the slidable component 200 as the cover 20 is lifted upwards relative to the case body 10 by the pushing components 300, such that the slidable component 200 is maintained in a position where the cover 20 is pushed upwards and supported by the pushing components 300. Since the user does not need to maintain the position of the slidable component 200 by hand, the user may remove the cover 20 with both hands.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A pushing mechanism configured to be disposed on a case body, and the pushing mechanism comprising:
   a fixed component configured to be disposed on the case body;
   a slidable component slidably disposed on the fixed component, wherein the slidable component comprises a connection plate and at least one guiding plate, the at least one guiding plate protrudes from the connection plate, the at least one guiding plate has a first supporting portion, a second supporting portion and an inclined guiding portion, the first supporting portion is located closer to the connection plate than the second supporting portion to the connection plate, the inclined guiding portion is connected between the first supporting portion and the second supporting portion, and the inclined guiding portion faces the fixed component; and at least one pushing component slidably disposed on the fixed component, wherein a slidable direction of the at least one pushing component is different from a slidable direction of the slidable component; and when the slidable component is moved relative to the fixed component, the at least one pushing component is guided by the at least one guiding plate of the slidable component to slide between the first supporting portion and the second supporting portion.

2. The pushing mechanism according to claim 1, further comprising at least one first slidable part and at least one second slidable part, wherein the at least one second slidable part is slidably disposed on the at least one first slidable part, the fixed component comprises a bottom plate and two side plates, the two side plates are respectively connected to two opposite sides of the bottom plate, the at least one first slidable part is located at the bottom plate of the fixed component, and the at least one second slidable part is located at the connection plate of the slidable component.

3. The pushing mechanism according to claim 2, further comprising at least one third slidable part and at least one fourth slidable part, wherein the at least one fourth slidable part is slidably disposed on the at least one third slidable part, the at least one third slidable part is located at one of the side plates of the fixed component, and the at least one fourth slidable part is located at the at least one pushing component.

4. The pushing mechanism according to claim 3, wherein the at least one third slidable part is a groove and the at least one fourth slidable part is a protrusion, and an extension direction of the at least one third slidable part is at an acute angle to a normal direction of the connection plate.

5. The pushing mechanism according to claim 2, further comprising an engagement component, wherein the engagement component comprises an elastic arm part and at least one engaging protrusion connected to each other, a fixed end of the elastic arm part is fixed to the bottom plate of the fixed component, the bottom plate of the fixed component has at least one through hole part, the connection plate of the slidable component has at least one engagement hole part, the at least one engaging protrusion is disposed through the at least one through hole part and is configured to be engaged with the at least one engagement hole part to maintain the at least one pushing component in a position where the at least one pushing component is supported by the second supporting portion of the at least one guiding plate.

6. The pushing mechanism according to claim 5, further comprising at least one elastic component, wherein one end of the at least one elastic component is connected to the fixed component, and another end of the at least one elastic component is connected to the slidable component.

7. The pushing mechanism according to claim 5, wherein a movable end of the elastic arm part extends beyond an outer edge of the bottom plate of the fixed component, the connection plate of the slidable component has a side edge, at least one engagement groove part and at least one groove opening part, the at least one groove opening part is connected to the at least one engagement groove part, and the at least one engagement groove part and the at least one groove opening part are recessed inward from the side edge.

8. The pushing mechanism according to claim 7, wherein the at least one groove opening part has a width increasing from one side closer to the at least one engagement groove part toward another side farther away from the at least one engagement groove part.

9. The pushing mechanism according to claim 1, wherein the at least one pushing component has an inclined guidance portion configured to be in contact with the inclined guiding portion of the at least one guiding plate.

10. The pushing mechanism according to claim 1, wherein the slidable component has an operation protrusion protruding from the connection plate.

11. The pushing mechanism according to claim 1, wherein a quantity of the at least one guiding plate is two and a quantity of the at least one pushing component is two, the two guiding plates are respectively connected to two opposite sides of the connection plate, and the two pushing components are respectively disposed on two opposite sides of the fixed component.

12. A casing comprising:
a case body having at least one through hole portion;
a cover having at least one first hook and covering the case body; and
a pushing mechanism disposed on the case body, and the pushing mechanism comprising:
a fixed component disposed on the case body;
a slidable component slidably disposed on the fixed component, wherein the slidable component comprises a connection plate and at least one guiding plate, the at least one guiding plate protrudes from the connection plate, the at least one guiding plate has a first supporting portion, a second supporting portion and an inclined guiding portion, the first supporting portion is located closer to the connection plate than the second supporting portion to the connection plate, the inclined guiding portion is connected between the first supporting portion and the second supporting portion, and the connection plate of the slidable component can be moved relative to the fixed component so as to be detached from the at least one first hook; and
at least one pushing component slidably disposed on the fixed component, wherein a slidable direction of the at least one pushing component is different from a slidable direction of the slidable component; when the slidable component is moved relative to the fixed component, the at least one pushing component is guided by the at least one guiding plate of the slidable component to slide from the first supporting portion to the second supporting portion, and the at least one pushing component pushes the cover so that the cover is at least partially spaced apart from the case body.

13. The casing according to claim 12, wherein the case body has at least one engagement opening portion, the cover has at least one second hook, and the at least one second hook is configured to be engaged with the at least one engagement opening portion.

14. The casing according to claim 12, further comprising at least one first slidable part and at least one second slidable part, wherein the at least one second slidable part is slidably disposed on the at least one first slidable part, the fixed component comprises a bottom plate and two side plates, the two side plates are respectively connected to two opposite sides of the bottom plate, the at least one first slidable part is located at the bottom plate of the fixed component, and the at least one second slidable part is located at the connection plate of the slidable component.

15. The casing according to claim 14, further comprising at least one third slidable part and at least one fourth slidable part, wherein the at least one fourth slidable part is slidably disposed on the at least one third slidable part, the at least one third slidable part is located at one of the side plates of the fixed component, and the at least one fourth slidable part is located at the at least one pushing component.

16. The casing according to claim 15, wherein the at least one third slidable part is a groove and the at least one fourth slidable part is a protrusion, and an extension direction of the at least one third slidable part is at an acute angle to a normal direction of the connection plate.

17. The casing according to claim 14, further comprising an engagement component, wherein the engagement component comprises an elastic arm part and at least one engaging protrusion connected to each other, a fixed end of the elastic arm part is fixed to the bottom plate of the fixed component, the bottom plate of the fixed component has at least one through hole part, the connection plate of the slidable component has at least one engagement hole part, the at least one engaging protrusion is disposed through the at least one through hole part and is configured to be engaged with the at least one engagement hole part to maintain the at least one pushing component in a position where the at least one pushing component is supported by the second supporting portion of the at least one guiding plate.

18. The casing according to claim 17, wherein a movable end of the elastic arm part extends beyond an outer edge of the bottom plate of the fixed component, the connection plate of the slidable component has a side edge, at least one engagement groove part and at least one groove opening part, the at least one groove opening part is connected to the at least one engagement groove part, the at least one engagement groove part and the at least one groove opening part are recessed inward from the side edge, and the at least one first hook is configured to pass through the at least one groove opening part and be engaged with the at least one engagement groove part.

19. The casing according to claim 18, wherein the at least one groove opening part has a width increasing from one side closer to the at least one engagement groove part toward another side farther away from the at least one engagement groove part.

20. The casing according to claim 12, wherein the slidable component has an operation protrusion protruding from the connection plate.

\* \* \* \* \*